United States Patent
Yang et al.

(10) Patent No.: US 9,591,107 B2
(45) Date of Patent: *Mar. 7, 2017

(54) DYNAMIC STATE MACHINE

(71) Applicant: Cisco Technology, Inc., San Jose, CA (US)

(72) Inventors: Fang Jin Yang, Burlingame, CA (US); Matthias J. Loeser, Pleasanton, CA (US); Sifang Li, Milpitas, CA (US)

(73) Assignee: Cisco Technology, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/996,826

(22) Filed: Jan. 15, 2016

(65) Prior Publication Data

US 2016/0134726 A1    May 12, 2016

Related U.S. Application Data

(63) Continuation of application No. 13/669,248, filed on Nov. 5, 2012, now Pat. No. 9,240,545.

(51) Int. Cl.
*H04L 29/06*    (2006.01)
*H04L 12/26*    (2006.01)
*H01L 43/12*    (2006.01)

(52) U.S. Cl.
CPC .............. *H04L 69/22* (2013.01); *H01L 43/12* (2013.01); *H04L 43/12* (2013.01)

(58) Field of Classification Search
CPC .. H04L 43/12; H04L 41/0681; G06K 9/00986
See application file for complete search history.

(56) References Cited

U.S. PATENT DOCUMENTS

| | | |
|---|---|---|
| 6,725,391 B2 | 4/2004 | Swoboda |
| 6,792,563 B1 | 9/2004 | DesRosier et al. |
| 7,325,164 B2 | 1/2008 | Swanson et al. |
| 7,332,929 B1 | 2/2008 | Normoyle et al. |
| 7,739,097 B2 | 6/2010 | Sample et al. |

(Continued)

OTHER PUBLICATIONS

Fang Jin Yang et al., U.S. Appl. No. 13/669,248, Notice of Allowance dated Sep. 14, 2015.

(Continued)

*Primary Examiner* — Siming Liu
(74) *Attorney, Agent, or Firm* — Baker Botts L.L.P.

(57) ABSTRACT

In certain embodiments, a method includes receiving, using one or more processors, a trigger expression. The method may include processing, using the one or more processors, the trigger expression, the trigger expression comprising a first one or more terms comprising a first one or more fields, to generate a reduced trigger expression. The reduced trigger expression includes a second one or more terms comprising a second one or more fields and being logically equivalent to the trigger expression. The method may include generating, using the one or more processors, a dynamic state machine by generating a first data structure comprising each of the second one or more fields, generating, based on the first data structure, an expanded trigger expression by adding one or more additional terms for possible state transitions, and generating, based on the expanded trigger expression, a second data structure.

21 Claims, 2 Drawing Sheets

(56) References Cited

U.S. PATENT DOCUMENTS

| | | | |
|---|---|---|---|
| 7,944,234 B2 | 5/2011 | Lunzer et al. | |
| 9,240,545 B2 * | 1/2016 | Yang | H04L 43/12 |
| 2003/0126502 A1 | 7/2003 | Litt | |
| 2009/0237110 A1 | 9/2009 | Lunzer et al. | |
| 2014/0126381 A1 | 5/2014 | Yang | |

OTHER PUBLICATIONS

Fang Jin Yang, et al., U.S. Appl. No. 13/669,248, Response to Non-Final Office Action dated Aug. 21, 2015.
Fang Jin Yang, et al., U.S. Appl. No. 13/669,248, Non-Final Office Action dated May 21, 2015.

* cited by examiner

| | CURRENT STATE | MASK AND MATCH REGISTER MODULE OUTPUT VECTOR | NEXT STATE |
|---|---|---|---|
| 306a | 0 | 1110XXX1 | TRIG_STATE |
| 306b | 0 | 1110XXX0 | EOP_STATE |
| 306c | 0 | 11XX1XXX | 1 |
| 306d | 1 | 11XX11X1 | TRIG_STATE |
| 306e | 0 | 11XXX1X0 | EOP_STATE |
| 306f | EOP_STATE | 1XXXXXX0 | EOP_STATE |
| 306g | EOP_STATE | 1XXXXXX1 | TRIG_STATE |
| 306h | TRIG_STATE | XXXXXXXX | TRIG_STATE |
FIG. 3
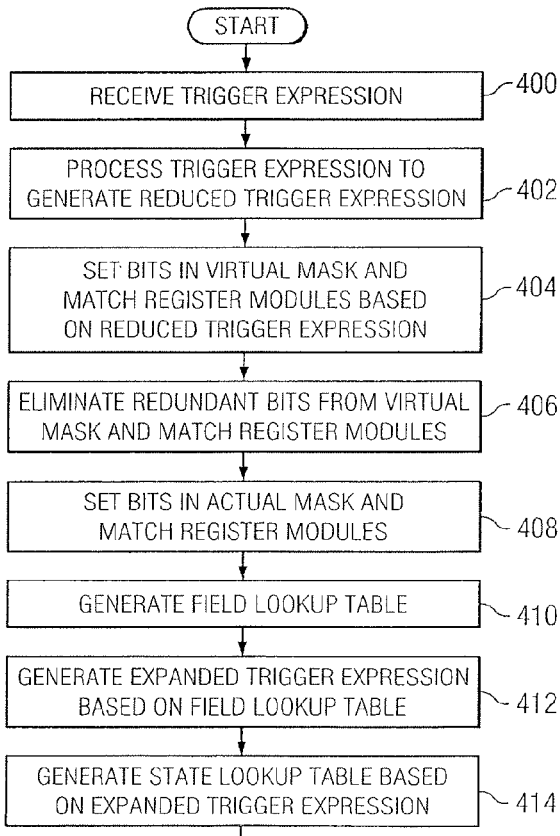
FIG. 4
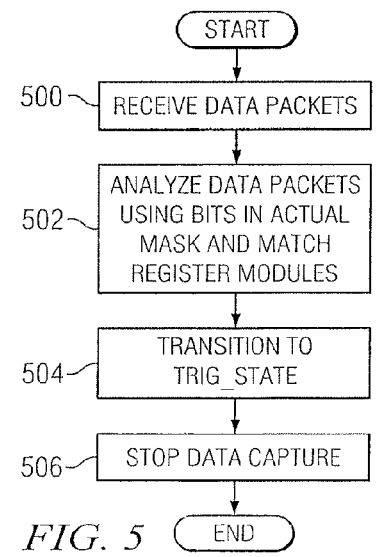
FIG. 5

DYNAMIC STATE MACHINE

RELATED APPLICATION

This application is a continuation under 35 U.S.C. §120 of U.S. application Ser. No. 13/669,248, filed Nov. 5, 2012, and entitled "Dynamic State Machine."

TECHNICAL FIELD

This disclosure relates generally to logic analysis, and more particularly to a dynamic state machine.

BACKGROUND

Data capture and analysis systems often support debugging and data "sniffing." With certain data capture and analysis systems, users may only specify data capture conditions using simple logic expressions. One possible solution to this limitation is to incorporate additional hardware to allow for more complex logic expressions. This solution is costly, however.

BRIEF DESCRIPTION OF THE DRAWINGS

For a more complete understanding of the present disclosure and its advantages, reference is now made to the following description, taken in conjunction with the accompanying drawings, in which:

FIG. 3 illustrates an example state lookup table for evaluating outputs of actual mask and match register modules in state machine module, according to certain embodiments of the present disclosure;

FIG. 4 illustrates an example method of generating a dynamic state machine in a state machine module, according to certain embodiments of the present disclosure; and FIG. 5 illustrates an example method for evaluating data packets using a logic analysis system.

DESCRIPTION OF EXAMPLE EMBODIMENTS

Overview

In certain embodiments, a method includes receiving, using one or more processors, a trigger expression. The method may include processing, using the one or more processors, the trigger expression, the trigger expression comprising a first one or more terms comprising a first one or more fields, to generate a reduced trigger expression. The reduced trigger expression includes a second one or more terms comprising a second one or more fields and being logically equivalent to the trigger expression. The method may include generating, using the one or more processors, a dynamic state machine by generating a first data structure comprising each of the second one or more fields, generating, based on the first data structure, an expanded trigger expression by adding one or more additional terms for possible state transitions, and generating, based on the expanded trigger expression, a second data structure.

EXAMPLE EMBODIMENTS

Figure 1:
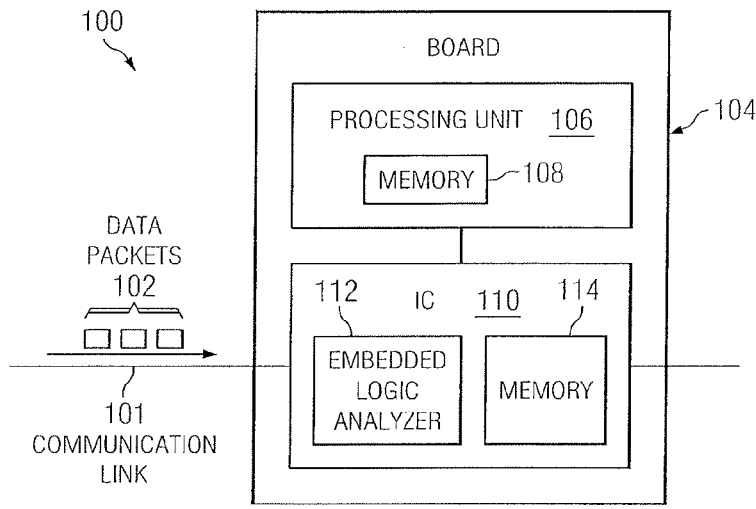
FIG. 1 illustrates an example logic analysis system for a dynamic state machine, according to certain embodiments of the present disclosure.

FIG. 1 illustrates an example logic analysis system 100 for a dynamic state machine, according to certain embodiments of the present disclosure. In the illustrated example, logic analysis system 100 includes communication link 101 transferring data packets 102, board 104, comprising processing unit 106 with memory 108, and integrated circuit 110 with embedded logic analyzer 112 and memory 114. Although logic analysis system 100 is illustrated and primarily described as including particular numbers and types of components arranged in a particular manner, the present disclosure contemplates logic analysis system 100 including any suitable numbers and types of components arranged in any suitable manner, according to particular needs.

Logic analysis system 100 may analyze logical expressions of varying complexity and implement suitable actions, where appropriate. In certain embodiments, these logical expressions may be evaluated to determine which data packets 102 (and/or items within data packets 102) to capture and/or analyze.

Communication link 101 may be a transmission path on which signals are dropped off or picked up at devices attached to communication link 101. These signals may include, for example, data packets 102. Communication link 101 facilitates wireless or wired communication. Communication link 101 may include one or more computer buses, local area networks (LANs), radio access networks (RANs), metropolitan area networks (MANs), wide area networks (WANs), mobile networks (e.g., using WiMax (802.16), WiFi (802.11), 3G, 4G, or any other suitable wireless technologies in any suitable combination), all or a portion of the global computer network known as the Internet, and/or any other communication system or systems at one or more locations, any of which may be any suitable combination of wireless and wired. In a particular example, communication link 101 comprises a signal bus.

Data packets 102 may be packets containing data that may be appropriate for analysis (e.g., based on a user-specified trigger expression). Data packets 102 may contain any suitable type of data, audio, video, or any other suitable data. For purposes of this disclosure, and for simplicity, the term "data" may refer to any suitable combination of text, voice, audio, video, multimedia, and any other suitable type of data, according to particular needs. Furthermore, although described as "packets," data packets 102 may take any suitable form according to particular needs.

Board 104 may be a thin rigid board for containing one or more electric circuits, one or more printed boards, or any suitable electrical structure or combination of electrical structures. Board 104 may include integrated circuit 110 and a processing unit 106. Although referred to primarily in the singular, board 104 may include one or more boards.

Integrated circuit 110 may be a field-programmable gate array (FPGA), an application-specific integrated circuit (ASIC), a processor, or any other suitable circuit. Integrated circuit 110 may include embedded logic analyzer 112. Embedded logic analyzer 112 may be a module for analyzing data of interest in data packets 102. Integrated circuit 110 and embedded logic analyzer 112 may be implemented with any suitable combination of hardware, firmware, and software.

Processing unit 106 may include one or more microprocessors, controllers, or any other suitable computing devices or resources. Processing unit 106 may work, either alone or with other components of logic analysis system 100, to provide a portion or all of the functionality of its associated logic analysis system 100 described herein. Memory 114 and memory 108 may take the form of volatile or non-volatile memory including, without limitation, magnetic media, optical media, read-access memory (RAM), read-only memory (ROM), removable media, or any other suitable memory component.

The components of logic analysis system 100 may be implemented in any suitable combination of hardware, firmware, and software.

It may be desirable for data packets 102 to be analyzed by a logic analysis system, such as logic analysis system 100. Logic analysis system 100 may analyze data packets 102 from communication link 101 using one or more logic analysis processes.

Logic analysis system 100 may receive, store, generate, and/or otherwise process one or more data packets 102. The present disclosure contemplates logic analysis system 100 having any suitable number of data packets 102 and requesting that logic analysis system 100 perform a logic analysis of any suitable number of data packets 102.

Logic analysis system 100 may access data packets 102 in any suitable manner. Logic analysis system 100 may tap into communication link 101 passing through integrated circuit 110 to access data packets 102 on communication link 101. This may be done without interfering with the transfer of data packets 102 on communication link 101 or any other functions of communication link 101.

In certain embodiments, processing unit 106 receives criteria (e.g., from a user) to analyze data packets 102. These criteria may be provided as a logical expression. More complex logical expressions may require additional hardware. For example, analysis of more complex logical expressions may require more mask and match registers, which are costly and limited in some systems. Given the increased cost and space needed for additional hardware, it may be advantageous for logic analysis system 100 to analyze complex logical expressions using limited hardware. It may also be advantageous for logic analysis system 100 to analyze data packets 102 for numerous clock cycles. In certain embodiments, logic analysis system 100 may accomplish these goals by using the received criteria to generate a dynamic state machine in processing unit 106 and/or by using logic-minimization techniques and programming embedded logic analyzer 112 accordingly. Using the dynamic state machine, created based on the received criteria, and logic-minimization techniques, logic analysis system 100 may analyze data packets 102 on communication link 101.

Figure 2:
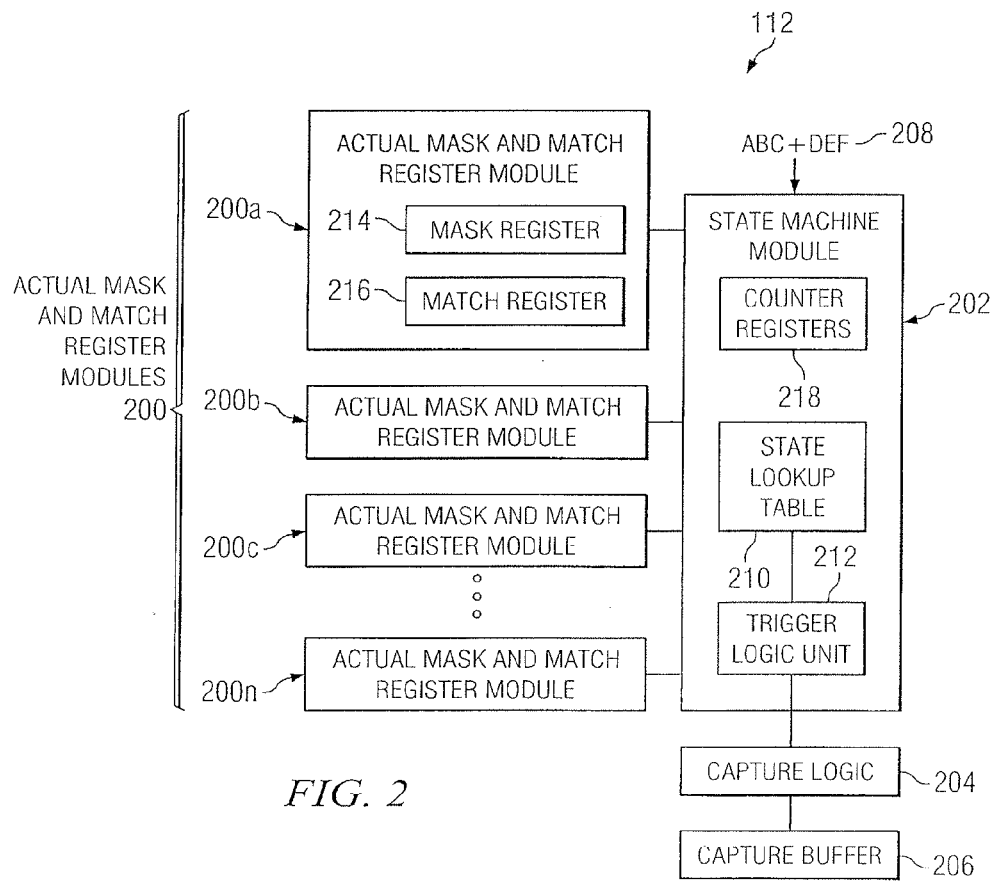
FIG. 2 illustrates an example embedded logic analyzer, according to certain embodiments of the present disclosure.

FIG. 2 illustrates an example embedded logic analyzer 112, according to certain embodiments of the present disclosure. Embedded logic analyzer 112 provides just one example of how embedded logic analysis system 100 (or a portion of logic analysis system 100) may be implemented. Although this particular example implementation of embedded logic analyzer 112 is illustrated and described, the present disclosure contemplates implementing embedded logic analyzer 112 in any suitable manner, according to particular needs. Embedded logic analyzer 112 may be implemented using any suitable combination of hardware, firmware, and software.

In the illustrated example, embedded logic analyzer 112 includes actual mask and match register modules 200, state machine module 202, capture logic 204, and capture buffer 206. State machine module 202 may include counter registers 218, state lookup table 210, and trigger logic unit 212, and may store or otherwise have access to trigger expressions 208. In certain embodiments, actual mask and match register module 200a includes mask register 214 and match register 216. The components of embedded logic analyzer 112 may be implemented with any suitable combination of hardware, firmware, and software.

Actual mask and match register modules 200 may be modules containing mask registers 214 and match registers 216. Mask register 214 may be a register programmed to define a mask to indicate bits within data packets 102 that embedded logic analyzer 112 should analyze. Match register 216 may be a register programmed to indicate which values the masked bits within data packets 102 should contain in order to satisfy all or a portion of trigger expression 208. In certain embodiments, mask register 214 and match register 216 have a fixed length such that a register is operable to store a certain number of bits.

Actual mask and match register module 200a may output a "1" when the masked bits of data packets 102 are the same as the corresponding values indicated in match register 216 and may output a "0" otherwise, the mask being defined by mask register 214. These meanings associated with "1" and "0" are for illustrative purposes only, and depending on the application needs, actual mask and match register modules 200 may have any suitable values. For example, actual mask and match register module 200a may output a "0" when the masked bits of data packets 102 are the same as the corresponding values indicated in match register 216 and may output a "1" otherwise. The output from each of actual mask and match register modules 200 may form an output vector and may be sent to state lookup table 210 in state machine module 202. In particular, the output from each of actual mask and match register modules 200 may form an output vector and may be sent to state lookup table 210 in state machine module 202.

State machine module 202 may store or otherwise have access to a trigger expression 208, and may comprise state lookup table 210, trigger logic unit 212, and counter registers 218 for the implementation of a dynamic state machine.

Trigger expression 208 may be an expression in the form of a logical equation. Trigger expression 208 is the input or task specification from a user. Logic analysis system 100 interprets trigger expression 208 and, based on the interpretation, programs actual mask and match register modules 200 and state lookup table 210 to perform one or more tasks based on the interpretation. State machine module 202 may receive trigger expression 208 from a user or in any other suitable manner. State machine module 202 may store, interpret, and/or analyze trigger expression 208. Trigger expression 208 may include one or more trigger terms, which may be logical expressions of trigger fields linked by one or more operators. Example operators may include "AND," "OR," "NOT," and any other suitable operators. For example, trigger expression 208 of "ABC+DEF" has two terms ("ABC" and "DEF"), six fields ("A," "B," "C," "D," "E," and "F"), and the operators "AND" (represented by a multiplication operator, i.e. "ABC" is equivalent to "A*B*C") and "OR" (represented by the "+" sign).

State lookup table 210 may be a table used to determine states in the state machine module 202. For example, state lookup table 210 may implement a dynamic state machine that allows logic analysis system 100 to determine the next state of logic analysis system 100 based on its current state, output from actual mask and match register modules 200, and any other suitable parameter such as information in counter registers 218. Although described as a table, state lookup table 210 may be any suitable data structure. State lookup table 210 will be described in greater detail with reference to FIG. 3.

Trigger logic unit 212 may contain logic that processes data from state lookup table 210 that is derived from trigger expression 208. In certain embodiments, trigger logic unit 212 may include one or more registers for indicating whether logic analysis system 100 has reached the trigger state, the current status of capture buffer 206, and any other suitable data.

Counter registers 218 may be one or more registers for storing a count for the logic analysis system 100. Counter registers 218 may increment by one or by any other suitable number in response to a signal from logic analysis system 100. The count stored in counter registers 218 may be an additional variable used by logic analysis system 100 in its analysis of data packets 102.

Capture logic 204 may be logic used to manage the capture of data packets 102. For example, capture logic 204 may determine that data packets 102 should be stored in capture buffer 206.

Capture buffer 206 may be a reserved area in memory for storing incoming data, such as data packets 102. For example, capture buffer 206 may store data packets 102 for analysis by logic analysis system 100.

Logic analysis system 100 may have a current state. Actual mask and match register modules 200 may generate output. State machine module 202 may use state lookup table 210 to determine the next state of logic analysis system 100 based on the current state, the output from actual mask and match register modules 200, and any other suitable parameter. In certain embodiments, the next state may additionally or alternatively be determined based on the count of counter registers 218. In certain embodiments, state machine module 202 may determine to issue a trigger event based on the state of logic analysis system 100 or may determine to increment counter registers 218, indicating a new clock cycle. Trigger logic unit 212 may compare the current state to a user-configured trigger state, which may be available in an associated register, and determine whether to trigger.

A trigger event may indicate that logic analysis system 100 should stop capturing data packets 102 or perform any other suitable action. A signal indicating a count increment may indicate that counter registers 218 should increment its count by one or any other suitable number. An increment in count may indicate a new clock cycle. Based on the signal and state machine module 202 reaching the configured trigger state, trigger logic unit 212 may trigger. Alternatively or in addition, logic analysis system 100 may trigger based on an external signal. If trigger logic unit 212 does not trigger, and based on the programming of state lookup table 210, trigger logic 212 may increment the count of counter registers 218. When the count of counter registers 218 is incremented, logic analysis system 100 may capture and analyze more data packets 102 and/or logic analysis system 100 may transition to a new state. Alternatively, if trigger logic unit 212 does not trigger, and based on the programming of state lookup table 210, trigger logic 212 may not increment the count of counter registers 218 and logic analysis system 100 may capture and analyze more data packets 102 and/or logic analysis system 100 may transition to a new state. Triggering may result in a signal to capture logic 204 and capture buffer 206 to stop capturing packets for analysis. Logic analysis system 100 may stop capturing packets instantaneously, after a specified period of time, after a specified number of clock cycles, or in any other manner.

In certain embodiments, state machine module 202 may transition from one state to another based on a counter comparison flag (indicating whether the count in counter registers 218 match a predetermined value), the current state of state machine module 202, and output from actual mask and match register modules 200. Bits used to indicate these elements may be any of "1," "0," and "x." The information resented by these values will be discussed in further detail in reference to FIG. 3. Counter registers 218 may be used to initiate a state transition but a trigger event may still be based on a comparison of the current state to a programmable register.

In certain embodiments, state machine module 202 may comprise a dynamic state machine for analyzing outputs of actual mask and match register modules 200. A dynamic state machine format may provide one or more technical advantages. For example, a state machine that is dynamic may use fewer actual mask and match register modules 200 than might otherwise be utilized for evaluating trigger expression 208 and data packets 102

Consider a trigger expression 208 of "AB+CD." This expression represents "A and B or C and D" and "AB" and "CD" are each terms in the expression. One actual mask and match register module 200 may be devoted to each of the terms, "AB" and "CD." With more complex expressions, this would require a greater number of actual mask and match register modules 200. However, a state machine that is dynamic may use fewer actual mask and match register modules 200 than might otherwise be utilized. For example, terms "AB" and "CD" may be equivalent so that storing bits for both terms in actual mask and match register modules 200 would be redundant. Using a dynamic state machine may reduce or eliminate the storage of redundant bits in actual mask and match register modules 200, allowing for fewer actual mask and match register modules 200 to be used, potentially freeing one or more actual mask and match register modules 200 for use with other terms and allowing more complex logical expressions to be evaluated. This may achieve an equally powerful logic-analyzer implementation with fewer actual mask and match register modules 200, saving valuable hardware resources and lowering implementation cost and power draw.

FIG. 3 illustrates an example state lookup table 210 for evaluating outputs of actual mask and match register modules 200 in state machine module 202, according to certain embodiments of the present disclosure. In certain embodiments, state lookup table 210 includes one or more of the following columns: current state 300, mask and match register module output vector 302, and next state 304. State lookup table 210 may also include rows 306 corresponding to different scenarios of current state 300 and output from actual mask and match register modules 200. Rows 306 may be operable to allow determination of next state 304 based on current state 300 and comparison of mask and match register module output vector 302 to output from actual mask and match register modules 200. Rows 306 may alternatively or additionally be operable to allow determination of next state 304 based on the count of counter registers 218.

Modifications, additions, or omissions may be made to state lookup table 210. State lookup table 210 may include more or fewer fields, and may include any data relevant to states, register output, or other suitable data. State lookup table 210 may include any suitable amount of data and may be stored in any suitable type or number of memories. For example, state lookup table 210 may, alternatively or in addition, include a counter-increment column and/or a counter-match column.

Logic analysis system 100 may be at some current state 300 when state lookup table 210 receives output from actual mask and match register modules 200. In the illustrated example, states are represented by "0," "1," "EOP_STATE," and "TRIG_STATE." These may represent states of "0," "1," "end of packet," and "trigger," all examples of possible states of state machine module 202.

Mask and match register module output vector 302 of state lookup table 210 may be used to compare output from actual mask and match register modules 200. Values of mask and match register module output vector 302 may contain the value "x" in any position, and in any one or more rows 306 of state lookup table 210, indicating to ignore the output from the particular corresponding actual mask and match register module 200. An "x" in mask and match register module output vector 302 may indicate that the output from a particular actual mask and match register module 200 is not being evaluated in the corresponding row 306 of state lookup table 210.

Alternatively or in addition, when state lookup table 210 is programmed, software may recognize an indication of a "Don't Care" value, indicated by an "x" and may substitute the value in mask and match register module output vector 302 with a "1" in a first row 306 and a "0" in a second row 306. For example, instead of including a row 306 indicating current state 300 of "0," mask and match register module output vector 302 of 111011X1, and next state 304 of "TRIG_STATE," state lookup table 210 may include two rows, one with current state 300 of "0," mask and match register module output vector 302 of "11101101," and next state 304 of "TRIG_STATE" and one with current state 300 of "0," mask and match register module output vector 302 of "11101111," and next state 304 of "TRIG_STATE." Either format of state lookup table 210 would achieve the same result: new state 304 of "TRIG_STATE" when current state 300 is "0" and output from actual mask and match register modules 200 is either "11101101" or "11101111."

An output vector from mask and match register modules 200 may be a vector comprising the output from each of mask and match register modules 200. The output vector may contain values indicating, for each of mask and match register modules 200, whether the masked bits in data packets 102 matched the corresponding bits of match register 216. For example, the output vector may contain a value indicating that, for a particular mask and match register module 200, the masked bits in data packets 102 matched the corresponding bits of match register 216. In this example, value's in the output vector indicating a match are represented by "1." The output vector may contain a value indicating that, for a particular mask and match register module 200, the masked bits in data packets 102 did not match the corresponding bits of match register 216. In this example, values in the output vector indicating no match are represented by "0."

In the illustrated example, state machine module 202 uses state lookup table 210 to lookup next state 304 based on current state 300 and comparison of mask and match register module output vector 302 to output from actual mask and match register modules 200.

As shown in row 306a in the example, logic analysis system 100 may have a current state 300 of 0 when it receives the output vector formed by output from actual mask and match registers 200. That vector is then evaluated against the programmed mask and match register module output vector 302 of "1110xxx1" from state lookup table 210 indicating that the first, second, third and eighth actual mask and match register modules 200 must have an output of "1," that the fourth actual mask and match register module 200 must have an output of "0," and that the output from the fifth, sixth and seventh actual mask and match register modules 200 is to be ignored, as represented by "x".

In the illustrated example, state machine module 202 may use state lookup table 210 to look up next state 304. In the illustrated example, row 306a of state lookup table 210 indicates that, when in current state 300 of "0" and having output from actual mask and match register modules 200 satisfying the criteria of mask and match register module output vector 302 of "1110xxx1," the next state 304 is "TRIG_STATE." In the example, logic analysis system 100 may transition to "TRIG_STATE," resulting in a trigger signal for logic analysis system 100 to stop capturing data packets 102.

In certain embodiments, logic analysis system 100 may automatically reset to current state 300 of "0." In at least certain other embodiments, logic analysis system 100 is reset by a user after a trigger event.

In certain embodiments, current state 300 and mask and match register module output vector 302, such as those listed in rows 306b, 306c, 306e, and 306f of state lookup table 210, may indicate that logic analysis system 100 should transition to a state other than a trigger state. Examples of these states in state lookup table 210 include "EOP_STATE" and "1."

For example, current state 300 of "0" and output from actual mask and match register modules 200 satisfying the criteria of mask and match register module output vector 302 of "1110xxx0" would indicate next state 304 of "EOP_STATE," as shown in row 306b. In this example, logic analysis system 100 would transition to a next state of "EOP_STATE" and, instead of triggering and resetting, logic analysis system 100 would continue to capture and evaluate data packets 102 until "TRIG_STATE" is reached. This may allow capture logic 204 to capture multiple qualified data packets 102, instead of just one qualified data packet 102.

In the example, state machine module 202 may use the next output vector from actual mask and match register modules 200 and the current state of "EOP_STATE" to determine the next state 304. For example, if the next output of actual mask and match register modules 200 satisfies the criteria of mask and match register module output vector 302 of "1xxxxxx0," row 306f of state lookup table 210 indicates that the next state is "EOP_STATE" so that logic analysis system 100 remains in "EOP_STATE" and continues to capture and evaluate data packets 102. Alternatively, if the next output of actual mask and match register modules 200 satisfies the criteria of mask and match register output vector 302 of "1xxxxxx1," row 306g of state lookup table 210 indicates that the next state is "TRIG_STATE" so that logic analysis system 100 transitions to "TRIG_STATE." Trigger logic 212 may be programmed to trigger once "TRIG_STATE," or any other state, is reached.

FIG. 4 illustrates an example method of generating a dynamic state machine in state machine module 202, according to certain embodiments of the present disclosure.

At step 400, logic analysis system 100 receives trigger expression 208. In certain embodiments, trigger expression 208 received at step 400 may provide conditions indicating how a computer module should capture one or more data packets 102 of interest and store one or more captured data packets 102 for analysis. Logic analysis system 100 may receive trigger expression 208 using one or more processors.

Processing unit 106 may process trigger expression 208 to generate a reduced trigger expression at step 402. The reduced trigger expression may contain a number of terms less than or equal to the number of terms in trigger expression 208 and be logically equivalent to trigger expression 208. In certain embodiments, the reduced trigger expression may be the expression with the least number of terms that is still logically equivalent to trigger expression 208. In certain embodiments, the processor may reduce trigger expression 208 using a modified Quine-McCluskey algorithm or any other suitable Boolean-expression-minimization algorithm.

A reduced trigger expression may provide one or more technical advantages. For example, reducing redundancies in trigger expression 208 may result in logic analysis system 100 being able to use fewer actual mask and match register modules 200. This may allow for analysis using more complex expressions and/or lower cost and space requirements.

At step 404 processing unit 106 may set one or more bits in virtual mask and match register modules, which are stored in its memory 108, based on the reduced trigger expression. For example, logic analysis system 100 may set virtual mask registers to indicate which bits inside data packets 102 should be compared and may set virtual match registers to indicate the values that the bits of interest should be compared to. Virtual mask and match register modules may be stored in memory and are a memory representation of actual mask and match registers modules 200 to be programmed later. This intermediate step of setting virtual mask and match register modules allow logic analysis system 100 to temporarily store initial mask and match register values and optimize the values before setting them in actual mask and match register modules 200. The values in bits of virtual mask and match registers may not be used to compare values of bits in data packets 102 but, instead, may serve to store temporary values before setting bits in actual mask and match register modules 200, at step 408.

Processing unit 106 may remove redundant bits from the virtual mask and match registers at step 406. For example, processing unit 106 may determine that two of the unmasked bits in virtual mask and match register modules overlap, meaning that either of the bits are sufficient to satisfy the condition of the other so that removing one bit will not change the outputs of the virtual mask and match register modules. Based on this, processing unit 106 may remove one or more bits from virtual mask and match register modules. Removing redundant bits from the virtual mask and match register before setting bits in actual mask and match register modules 200 based on the bits in the virtual mask and match register modules may provide one or more technical advantages. For example, eliminating redundant bits may result in logic analysis system 100 being able to use fewer actual mask and match register modules 200. This may allow for analysis using more complex expressions and/or lower cost and space requirements.

Processing unit 106 may set bits in actual mask and match register modules 200 at step 408. In certain embodiments, each of actual mask and match register modules 200 stores match criteria for data in at least one clock cycle. Setting the plurality of bits in actual mask and match register modules 200 may comprise setting a valid bit in a first actual mask and match register module 200, setting a start-of-packet bit in a second actual mask and match register module 200, and setting other bits in one or more other actual mask and match register modules 200 based on the one or more bits in the one or more virtual mask and match registers. Logic analysis system 100 may set mask registers 214 of actual mask and match register modules 200 to indicate which bits inside data packets 102 should be compared and may set match registers 216 of actual mask and match register modules 200 to indicate the values that the masked bits should be compared to. For example, a bit in mask register 214 may be set with a "1" indicating that the corresponding bit of data packet 102 should be compared to the corresponding bit in the corresponding match register 216. The corresponding match register 216 bit may be set with a value to be compared to the corresponding bit of data packet 102. As another example, a bit in mask register 214 may be set with a "0" indicating that the corresponding bit of data packet 102 should not be compared to a corresponding bit in the corresponding match register 216.

Logic analysis system 100 may generate a dynamic state machine in state machine module 202 at steps 410-412. In certain embodiments, it may be advantageous to create a state machine that is dynamic. A static state machine may restrict the possible trigger expressions 208 that a user can enter and limit the capabilities of logic analysis system 100. A dynamic state machine may be flexible in accommodating complex trigger expressions 208 and may expand the functionality of logic analysis system 100. This flexibility may allow for fewer actual mask and match register modules 200 than would be needed for a static state machine, allowing for lower required cost and space.

At step 410, logic analysis system 100 may generate a field lookup table based on the reduced trigger expression and containing fields in the reduced trigger expression. The purpose of the field lookup table is to store all fields in trigger expression 208. The structure of the field lookup table may be an array of lists or any suitable data structure. A "line" (e.g., a row of the field lookup table) may represent a clock cycle. Each entry in the array may represent a line, and each list may contain the fields of that line.

At step 412, logic analysis system 100 may generate, based on the field lookup table, an expanded trigger expression by adding one or more additional terms to account for possible state transitions. In certain embodiments, the general algorithm for doing this is by traversing through trigger expression 208 and expanding out trigger terms by adding fields and permutations of terms to account for possible state transitions. Processing unit 106 may add additional terms to help with state transitions in two steps. In the first step, processing unit 106 may add teens to account for line transitions. For example, "A0+C1" is a trigger expression 208 with "A" and "C" representing fields for comparison and "0" and "1" representing the clock cycle (line) associated with the comparison. This register expression is used to capture the signal that has "A" in clock cycle "0" or "C" in clock cycle "1." As the example indicates, trigger expression 208 may be considered a Boolean expression with fields spanning multiple clock cycles. In the case of this trigger expression 208, processing unit 106 expands trigger expression 208 to "A0+A'0C1." Adding the "A'" field in front of "C" accounts for what must happen in line "0" for that term in order to reach a state for which the field "C" is compared. To check for a missing line, processing unit 106 iterates a term and performs a search for any gaps between the line numbers of fields in the term. Processing unit 106 inserts fields into a term, sorting the fields by line number first, and by label second. Therefore, processing unit 106 may easily determine if a line is missing.

Processing unit 106 may iterate through the expanded expression and iteratively populate state lookup table 210. Processing unit 106 may assign each term in trigger expression 208 a number of entries in state look up table 210 depending on how many lines the fields of the term span. As processing unit 106 iterates through each field in each term, processing unit 106 may update the entry in state look up table 210 (which indicates the values of the actual mask and match register modules 200 required for a state transition)

according to whether an equality or non-equality operator is present in the field. For example, if a field in actual mask and match register module 200a has an equality operator, processing unit 106 sets the entry of state lookup table 210 for actual mask and match register module 200a to "1."

The purpose of expanding trigger expression 208 may be to add a set of terms that account for possible state transitions that may occur based on existing trigger expression 208. By expanding trigger expression 208, it may become possible for processing unit 106 to iterate through it only once and create a dynamic state machine to account for all possible state transitions. For example, consider trigger expression 208 of "A0B1+A0D2." Trigger expression 208 may be expanded to "A0B1+A0B'1D2." When processing unit 106 generates the state machine, processing unit 106 may iterate trigger expression 208 and determine that, if "A" is matched in line "0," processing unit 106 should check line "1" for "B." If "B" is matched, logic analysis system 100 may trigger, and otherwise, may continue to line "2" and check for "D."

In certain embodiments, processing unit 106 adds new entries to the state lookup table 210 if the current line differs from the next line. Because each field in a trigger term is sorted by line, processing unit 106 recognizes that, if the current and next lines differ, a state transition is required. Every time a new entry is about to be inserted into the state lookup table 210, processing unit 106 may determine if a state already exists in the state machine. If the state already exists, processing unit 106 may create updated values that can be used for the next state.

Certain embodiments of the present disclosure may provide one or more technical advantages. For example, certain embodiments may provide users the ability to capture data using complex expressions without requiring extensive hardware.

Other technical advantages of the present disclosure will be readily apparent to one skilled in the art. Moreover, while specific advantages have been enumerated, various embodiments may include all, some, or none of the enumerated advantages.

Modifications, additions, or omissions may be made to this method. This method may include more, fewer, or other steps. Additionally, the steps may be performed in any suitable order. Any suitable component of logic analysis system 100 may perform one or more steps of this method.

FIG. 5 illustrates an example method for evaluating data packets 102 using logic analysis system 100. For example, logic analysis system 100 may receive instructions to stop evaluating data packets 102 if the data in data packets 102 satisfies a condition specified in trigger expression 208. Logic analysis system 100 may monitor the data of interest in received data packets 102 and, if logic analysis system 100 determines that the data of interest in data packets 102 satisfies the specified condition, logic analysis system 100 may send a signal for logic analysis system 100 to stop evaluating data packets 102.

In certain embodiments, embedded logic analyzer 112 receives one or more data packets 102 at step 500. For example, embedded logic analyzer 112 may receive data packets 102 from communication link 101. In certain embodiments, capture logic 204 may determine which data packets 102 on communication link 101 to capture for analysis. Capture buffer 206 may store data packets 102 for analysis.

Embedded logic analyzer 112 may analyze data packets 102 using bits in actual mask and match register modules 200 at step 502. For example, mask registers 214 may indicate which of the bits in data packets 102 logic analysis system 100 should analyze. Match registers 216 may indicate what the values of the bits of interest should be in order to indicate a match. Based on the bits of interest indicated by the bits masked by mask register 214 and their comparison with bits in match registers 216, each of actual mask and match register modules 200 may generate an output of "1" or "0" and the output from all of actual mask and match register modules 200 may be combined to form an output vector.

At step 504, embedded logic analyzer 112 may transition states based on the analysis of data packets 102, to arrive at the "TRIG_STATE." For example, embedded logic analyzer 112 may be at a current state 300 of "0" when actual mask and match register modules 200 output a vector of "11101111." In the illustrated example, row 306a of state lookup table 210 indicates that, based on this current state 300 and output from actual mask and match register modules 200, which satisfies the conditions of mask and match register module output vector 302 of "1110xxx1," next state 304 is "TRIG_STATE," resulting in embedded logic analyzer 112 transitioning to "TRIG_STATE." This example is for illustrative purposes only and embedded logic analyzer 112 may arrive at "TRIG_STATE" based on any suitable conditions and may transition to and from any suitable combination of states before arriving at "TRIG_STATE."

In certain embodiments, embedded logic analyzer 112 may stop data capture in response to arriving at "TRIG_STATE" at step 506. For example, trigger logic unit 212, in response to embedded logic analyzer 112 arriving at "TRIG_STATE," may send a signal to capture logic 204 indicating that logic analysis system 100 should cease capturing data packets 102. In response, capture logic 204 may stop storing data packets 102 on capture buffer 206.

Modifications, additions, or omissions may be made to this method. This method may include more, fewer, or other steps. Additionally, the steps may be performed in any suitable order. Any suitable component of logic analysis system 100 may perform one or more steps of this method.

Although the present disclosure has been described in several embodiments, a myriad of changes and modifications may be suggested to one skilled in the art, and it is intended that the present disclosure encompass such changes and modifications as fall within the scope of the present appended claims.

What is claimed is:
1. A method, comprising:
receiving, using one or more processors, a trigger expression;
processing, using the one or more processors, the trigger expression, the trigger expression comprising a first one or more terms comprising a first one or more fields, to generate a reduced trigger expression, the reduced trigger expression comprising a second one or more terms comprising a second one or more fields and being logically equivalent to the trigger expression; and
generating, using the one or more processors, a dynamic state machine by performing operations comprising:
generating a first data structure comprising each of the second one or more fields;
generating, based on the first data structure, an expanded trigger expression by adding one or more additional terms for possible state transitions; and
generating, based on the expanded trigger expression, a second data structure.

2. The method of claim 1, further comprising:
setting, based on the reduced trigger expression, one or more bits in one or more virtual mask and match register modules;
modifying the one or more bits in the one or more virtual mask and match register modules by eliminating one or more redundant bits to generate one or more modified bits; and
setting a plurality of bits in a plurality of actual mask and match register modules.

3. The method of claim 2, wherein setting the plurality of bits in the plurality of actual mask and match register modules comprises setting one or more bits in one or more mask and match registers based on the one or more modified bits.

4. The method of claim 1, wherein processing the trigger expression to generate the reduced trigger expression comprises processing the trigger expression using a modified Quine-McCluskey algorithm.

5. The method of claim 1, wherein the trigger expression provides conditions indicating how a computer module should capture one or more data packets of interest and store one or more captured data packets for analysis.

6. The method of claim 1, wherein each of a plurality of actual mask and match register modules is operable to store match criteria for data packets in at least one clock cycle.

7. The method of claim 1, wherein the second data structure comprises one or more of the following:
a current state column;
a mask and match register module output vector column;
a next state column;
a counter-increment column; and
a counter-match column;
the next state column comprising one or more next states, the one or more next states comprising a trigger state.

8. The method of claim 1, further comprising:
receiving one or more data packets;
analyzing, using one or more of the plurality of bits in a plurality of actual mask and match register modules, the one or more data packets;
determining, based on analyzing the one or more data packets using the second data structure, the trigger state; and
in response to determining the trigger state, stopping capture of data packets.

9. The method of claim 1, further comprising:
receiving one or more data packets;
analyzing, using one or more of the plurality of bits in a plurality of actual mask and match register modules, the one or more data packets;
determining, based on analyzing the one or more data packets using the second data structure, a state other than the trigger state; and
in response to determining the state other than the trigger state, continuing to capture data packets.

10. The method of claim 1, wherein the reduced trigger expression is the expression with the least number of terms that is still logically equivalent to the trigger expression.

11. A system comprising
one or more actual mask and mask register modules, the one or more actual mask and match register modules comprising one or more mask registers and one or more match registers; and
a processor operable to:
receive a trigger expression;
process the trigger expression, the trigger expression comprising a first one or more terms comprising a first one or more fields, to generate a reduced trigger expression, the reduced trigger expression comprising a second one or more terms comprising a second one or more fields and being logically equivalent to the trigger expression; and
generate a dynamic state machine by performing operations comprising:
generating a first data structure comprising each of the second one or more fields;
generating, based on the first data structure, an expanded trigger expression by adding one or more additional terms for possible state transitions; and
generating, based on the expanded trigger expression, a second data structure.

12. The system of claim 11, the processor being further operable to:
set, based on the reduced trigger expression, one or more bits in one or more virtual mask and match register modules;
modify the one or more bits in the one or more virtual mask and match register modules by eliminating one or more redundant bits to generate one or more modified bits; and
set, based on the one or more modified bits, a plurality of bits in the one or more actual mask and match register modules.

13. The system of claim 12, wherein setting the plurality of bits in the one or more actual mask and match register modules comprises setting one or more bits in the one or more mask and match registers based on the one or more modified bits.

14. The system of claim 11, wherein processing the trigger expression to generate the reduced trigger expression comprises processing the trigger expression using a modified Quine-McCluskey algorithm.

15. The system of claim 11, wherein the trigger expression provides conditions indicating how a computer module should capture one or more data packets of interest and store one or more captured data packets for analysis.

16. The system of claim 11, wherein each of the one or more actual mask and match register modules is operable to store match criteria for data packets in at least one clock cycle.

17. The system of claim 11, wherein the second data structure comprises one or more of the following:
a current state column;
a mask and match register module output vector column;
a next state column;
a counter-increment column; and
a counter-match column;
the next state column comprising one or more next states, the one or more next states comprising a trigger state.

18. The system of claim 11, wherein the processor is further operable to:
receive one or more data packets;
analyze, using one or more of the plurality of bits in the plurality of actual mask and match register modules, the one or more data packets;
determine, based on analyzing the one or more data packets using the second data structure, the trigger state; and
in response to determining the trigger state, stop capture of data packets.

19. The system of claim 11, wherein the processor is further operable to:

receive one or more data packets;

analyze, using one or more of the plurality of bits in the plurality of actual mask and match register modules, the one or more data packets;

determine, based on analyzing the one or more data packets using the second data structure, a state other than the trigger state; and in response to determining the state other than the trigger state, continue to capture data packets.

20. The system of claim 11, wherein the reduced trigger expression is the expression with the least number of terms that is still logically equivalent to the trigger expression.

21. A non-transitory computer-readable medium comprising logic that, when executed by one or more processors, is operable to perform operations comprising:

receiving a trigger expression;

processing the trigger expression, the trigger expression comprising a first one or more terms comprising a first one or more fields, to generate a reduced trigger expression, the reduced trigger expression comprising a second one or more terms comprising a second one or more fields and being logically equivalent to the trigger expression; and generating a dynamic state machine by performing operations comprising:

generating a first data structure comprising each of the second one or more fields;

generating, based on the first data structure, an expanded trigger expression by adding one or more additional terms for possible state transitions; and generating, based on the expanded trigger expression, a second data structure.

* * * * *